US009490026B2

(12) United States Patent
Hu et al.

(10) Patent No.: US 9,490,026 B2
(45) Date of Patent: Nov. 8, 2016

(54) NONVOLATILE MEMORY ERASURE METHOD AND DEVICE

(71) Applicant: GIGADEVICE SEMICONDUCTOR (BEIJING) INC., Beijing (CN)

(72) Inventors: Hong Hu, Beijing (CN); Linkai Wang, Beijing (CN)

(73) Assignee: GIGADEVICE SEMICONDUCTOR (BEIJING) INC., Beijing (CN)

( * ) Notice: Subject to any disclaimer, the term of this patent is extended or adjusted under 35 U.S.C. 154(b) by 0 days.

(21) Appl. No.: 14/897,646

(22) PCT Filed: Apr. 24, 2014

(86) PCT No.: PCT/CN2014/076147
§ 371 (c)(1),
(2) Date: Dec. 11, 2015

(87) PCT Pub. No.: WO2015/127713
PCT Pub. Date: Sep. 3, 2015

(65) Prior Publication Data
US 2016/0125952 A1 May 5, 2016

(30) Foreign Application Priority Data

Feb. 28, 2014 (CN) .......................... 2014 1 0073647

(51) Int. Cl.
*G11C 16/06* (2006.01)
*G11C 16/34* (2006.01)
*G11C 16/16* (2006.01)
*G11C 16/14* (2006.01)
*G11C 16/28* (2006.01)
G11C 16/10 (2006.01)

(52) U.S. Cl.
CPC ........... *G11C 16/3459* (2013.01); *G11C 16/14* (2013.01); *G11C 16/16* (2013.01); *G11C 16/28* (2013.01); *G11C 16/3477* (2013.01); *G11C 16/107* (2013.01); *G11C 16/3436* (2013.01)

(58) Field of Classification Search
CPC .............. G11C 16/0483; G11C 16/26; G11C 11/5628; G11C 11/5642; G11C 16/06; G11C 16/3418; G11C 16/24; G11C 2211/5646; G11C 8/08; G11C 11/1675; G11C 11/5607; G11C 11/5664
USPC .............. 365/185.18, 185.21, 185.02, 185.2, 365/185.22, 148, 185.17, 185.23, 185.25, 365/196, 238.5
See application file for complete search history.

(56) References Cited

U.S. PATENT DOCUMENTS 7,038,950 B1 * 5/2006 Hamilton ............ G11C 11/5628
365/185.2
2011/0063917 A1 3/2011 Shiino et al.

FOREIGN PATENT DOCUMENTS

CN 101887758 A 11/2010
CN 102237136 A 11/2011
(Continued)

Primary Examiner — Thong Q Le
(74) Attorney, Agent, or Firm — Gokalp Bayramoglu

(57) ABSTRACT

Disclosed are non-volatile memory erasure method and device for solving the problem of unnecessary time expenditure and complex process of the current erasure operation. The method comprises: after receiving an erasure instruction, performing a pre-reading verification on the target erasure area corresponding to the erasure instruction; if the pre-reading verification passes, then performing an erasure operation on the target erasure area; if not, then performing pre-programming verification on the target erasure area, and after the pre-programming verification passes, performing the erasure operation on the target erasure area. The method of the present application can eliminate the unnecessary pre-programming verification process while ensuring the target erasure area is in a full-erasure state before the erasure operation, thus saving erasure time and simplifying the erasure process.

13 Claims, 3 Drawing Sheets

(56) References Cited

FOREIGN PATENT DOCUMENTS

| CN | 102800362 A | 11/2012 |
| CN | 102881329 A | 1/2013 |
| CN | 103310839 A | 9/2013 |
| CN | 103425587 A | 12/2013 |
| CN | 103426474 A | 12/2013 |

* cited by examiner

NONVOLATILE MEMORY ERASURE METHOD AND DEVICE

This application is a continuation of International Application No. PCT/CN2014/076147, Field Apr. 24, 2014, which claims priority from Chinese Patent Application No. 201410073647.7, titled "Nonvolatile memory erasure method and device", filed on Feb. 28, 2014 in the Chinese Intellectual Property Office, the contents of which in its entirety are herein incorporated by reference.

TECHNICAL FIELD

The present application relate to the field of semiconductor memory, and more particularly to non-volatile memory erasure method and device.

BACKGROUND

Non-volatile memory refers to a memory which is capable of keeping data after power-off (that is, stored date cannot be lost after power-off). EEPROM (Electrically Erasable Programmable Read-Only Memory) and flash memory (Flash Memory) all belong to the non-volatile memory. The non-volatile memory includes a plurality of memory cells and stores information by changing the number of electrons in floating gate of the memory cell. In the process of programming, after the electrons are injected into the floating gate of the memory cell, the threshold voltage of the memory cell is increased and in this point the memory cell is in a programmed state; in the process of erasing, after the trapped electrons in the floating gate are removed, the threshold voltage of the memory cell is reduced and at this point the memory cell is in a erased state. After programming or erasing is completed, data are stored in the non-volatile memory. At the moment, the memory cells of the non-volatile memory generally include both program cell (Pgm cell) and erase cell (Erase cell), which have different threshold voltages.

Erasure operation of the non-volatile memory is performed by blocks, that is, the erasure operation is performed on memory cells within one target erasure area each time. However, since the target erasure area may include both Erase cells and Pgm cells which may have significantly different threshold voltages before the erasure operation, if the erasure operation is directly performed on the target erasure area, then it may be difficult to ensure a convergence of threshold voltages of memory cells within the target erasure area after the erasure operation is completed.

To solve the above problems, a general method at present is to add a pre-programming process before the erasure operation. That is, a programming operation is first performed on Erase cells in a target erasure area to program them into Pgm cells, such that threshold voltages of memory cells within the target erasure area are relatively convergent; after the pre-programming operation is completed, an erasure operation is performed on the target erasure area.

Through above method, threshold voltage distribution of the memory cells within the target erasure area may have a good convergence after erasure operation. However, above process may increase the execution time of entire erasure operation; in particular, if the target erasure area is in a full-erasure state (that is, the memory cells in the target erasure area are all Erase cells) before erasure operation, the pre-programming process still may program all the Erase cells within the target erasure area in to the Pgm cells and then perform the erasure operation, which causes unnecessary time expenditure and complex process.

SUMMARY

The present application provides non-volatile memory erasure method and device, for solving the problems of unnecessary time expenditure and complex process of the current erasure operation.

To address above problems, in the present application there is disclosed a non-volatile memory erasure method, wherein, the method includes:

after receiving an erasure instruction, performing pre-reading verification on a target erasure area corresponding to the erasure instruction;

if the pre-reading verification passes, then performing an erasure operation on the target erasure area; and if the pre-reading verification fails, then performing pre-programming verification on the target erasure area, and after the pre-programming verification passes, performing the erasure operation on the target erasure area.

Preferably, the step of performing pre-reading verification on the target erasure area corresponding to the erasure instruction includes: performing the pre-reading verification on the target erasure area, according to a predefined pre-reading verification reference voltage;

the step of performing pre-programming verification on the target erasure area includes: performing the pre-programming verification on the target erasure area, according to a predefined pre-programming verification reference voltage, wherein, the pre-reading verification reference voltage is less than or equal to the pre-programming verification reference voltage.

Preferably, the target erasure area comprises a plurality of memory cells, the step of performing the pre-reading verification on the target erasure area according to the predefined pre-reading verification reference voltage includes:

verifying whether the threshold voltage of each memory cell within the target erasure area is less than the pre-reading verification reference voltage, respectively;

if the threshold voltage of each memory cell is less than the pre-reading verification reference voltage, then determining the pre-reading verification passes; otherwise determining the pre-reading verification fails.

Preferably, the step of verifying whether the threshold voltage of each memory cell within the target erasure area is less than the pre-reading verification reference voltage respectively includes:

for each memory cell within the target erasure area, applying a predefined pre-reading verification voltage to a gate of the memory cell and detecting a drain current of the memory cell; and if the drain current of the memory cell is greater than a predefined pre-reading verification reference current, then determining the threshold voltage of the memory cell is less than the pre-reading verification reference voltage.

Preferably, before performing the erasure operation on the target erasure area, the method further includes:

performing erasure verification on the target erasure area;

if the erasure verification fails, then executing the step of performing the erasure operation on the target erasure area; and after the erasure operation, returning to the step of performing the erasure verification on the target erasure area.

Preferably, the step of performing the erasure verification on the target erasure area includes:

performing the erasure verification on the target erasure area, according to a predefined erasure verification reference voltage, wherein, the erasure verification reference voltage is less than or equal to the pre-reading verification reference voltage.

Preferably, after performing the pre-programming verification on the target erasure area, the method further includes:

if the pre-programming verification fails, then performing a pre-programming operation on the target erasure area; and after the pre-programming operation, returning to the step of performing the pre-programming verification on the target erasure area.

According to another aspect of the application, there is also disclosed a non-volatile memory erasure device, wherein, the device includes:

a pre-reading verification module, configured to, after receiving an erasure instruction, perform pre-reading verification on a target erasure area corresponding to the erasure instruction;

an erasure module, configured to, when the pre-reading verification passes, perform an erasure operation on the target erasure area; and a pre-programming verification module, configured to, when the pre-reading verification fails, perform pre-programming verification on the target erasure area, the erasure module being further configured to, when the pre-programming verification passes, perform the erasure operation on the target erasure area.

Preferably, the pre-reading verification module is particularly configured to perform the pre-reading verification on the target erasure area according to a predefined pre-reading verification reference voltage;

the pre-programming verification module is particularly configured to perform the pre-programming verification on the target erasure area, according to a predefined pre-programming verification reference voltage, wherein, the pre-reading verification reference voltage is less than or equal to the pre-programming verification reference voltage.

Preferably, the target erasure area comprises a plurality of memory cells, the pre-reading verification module includes:

a voltage verification module, configured to verify whether the threshold voltage of each memory cell within the target erasure area is less than the pre-reading verification reference voltage, respectively; and a determination module, configured to determine the pre-reading verification passes if the threshold voltage of each memory cell is less than the pre-reading verification reference voltage; otherwise, determine the pre-reading verification fails.

Preferably, the voltage verification module includes:

a detection module, configured to, for each memory cell within the target erasure area, apply a predefined pre-reading verification voltage to a gate of the memory cell and detect a drain current of the memory cell, and a determination module, configured to determine the threshold voltage of the memory cell is less than the pre-reading verification reference voltage, if the drain current of the memory cell is greater than the predefined pre-reading verification reference current.

Preferably, the device further includes:

an erasure verification module, configured to, before the erasure module performs the erasure operation on the target erasure area, perform erasure verification on the target erasure area;

the erasure module being further configured to, when the erasure verification fails, perform the erasure operation on the target erasure area, and the erasure verification module being further configured to, after the erasure module performs the erasure operation on the target erasure area, perform the erasure verification on the target erasure area.

Preferably, the erasure verification module, the erasure verification module is particularly configured to perform the erasure verification on the target erasure area, according to a predefined erasure verification reference voltage, wherein, the erasure verification reference voltage is less than or equal to the pre-reading verification reference voltage.

Preferably, the device further includes:

a pre-programming module, configured to, when the pre-programming verification fails, perform a pre-programming operation on the target erasure area, the pre-programming verification module being further configured to, after the pre-programming module performs the pre-programming operation on the target erasure area, perform the pre-programming verification on the target erasure area.

According to still another aspect of the application, there is also disclosed a computer readable recording medium, which stores thereon computer program that, when executed by one or more processors of a non-volatile memory erasure device, causes the device to perform:

after receiving an erasure instruction, performing pre-reading verification on a target erasure area corresponding to the erasure instruction;

if the pre-reading verification passes, then performing an erasure operation on the target erasure area; and if the pre-reading verification fails, then performing pre-programming verification on the target erasure area, and after the pre-programming verification passes, performing the erasure operation on the target erasure area.

Compared with the prior art, the present application may have following advantages:

In the present application, after the erasure instruction is received, the pre-reading verification is first performed on the target erasure area corresponding to the erasure instruction; if the pre-reading verification passes, then the erasure operation may be performed on the target erasure area; if the pre-reading verification fails, then the pre-programming verification may be performed on the target erasure area, and after the pre-programming verification passes, the erasure operation may be performed on the target erasure area. In the application, the pre-reading verification is first performed prior to the pre-programming verification. If the pre-reading verification passes, the pre-programming verification process could be skipped to directly perform the erasure operation. Therefore, it is possible to eliminate unnecessary pre-programming verification process while ensuring the target erasure area is in the full-erasure state before the erasure operation, thereby saving erasure time and simplifying the erasure process.

DETAILED DESCRIPTION

Figure 1:
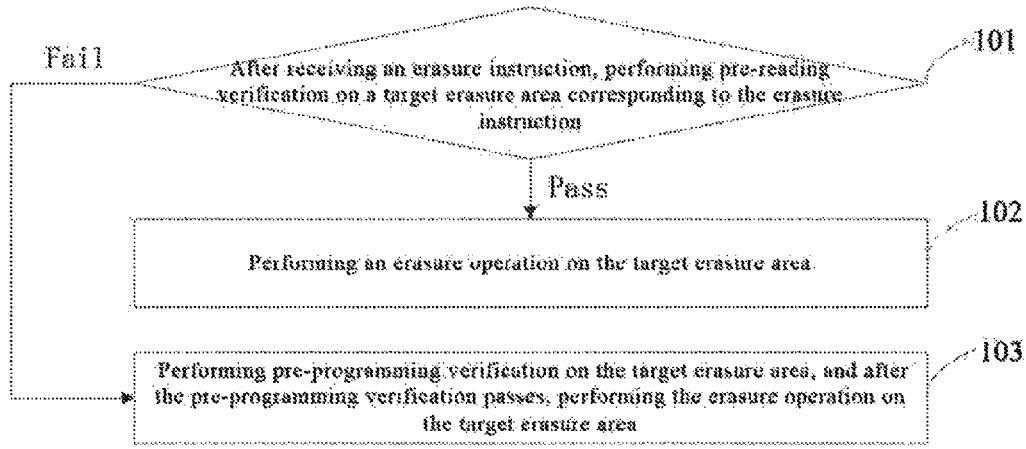
FIG. 1 is a flow chart showing a non-volatile memory erasure method according to a first embodiment of the application.

In order to readily understand the objectives, the features and the advantages as set forth, the present application will be further described in detail in conjunction with accompanying figures and specific embodiments.

With the rapid development and widespread application of various electronic apparatuses and embedded systems, such as computers, personal digital assistants, mobile phones, digital cameras, etc. a non-volatile (stored data information can be kept in despite of power-off) memory device having multiple-time programmability, high capacity, fast, convenient and simple read-write and erase, less peripheral accessories and low cost is in great demand. The non-volatile memory device emerges under this demand background. Core of the non-volatile memory is an array of memory cells. Usually, the memory cell is a charge-storable floating gate device. Compared with a general MOS (MOS is metal-oxide-semiconductor field effect transistor), in addition to a source electrode, drain electrode and a gate electrode, the memory cell extra has a charge-storable floating gate. As it could be seen, its structure is slightly different from the general MOS by having a floating gate. The floating gate is insulated from remaining part for storing charges. As far as a common design for the non-volatile memory is concerned, data can be deleted only in the form of whole chip, whole block or sector rather than single byte.

In order that those skilled in the art can better understand the present application, first operating principles of several non-volatile memories will be simply introduced.

A typical non-volatile memory includes EPROMs (Erasable Programmable Read-Only Memory), EEPROMs and flash memories. EPROM is the one in which contents can be wiped off by special means and then re-written. Its basic cell circuit often employs a floating gate avalanche injection MOS circuit. It is similar to the MOS circuit, in which two P-type regions having high concentration are usually grown on an N-type substrate, and then a source electrode S and a drain electrode D are drawn out through Ohmic contact. Between the source and drain, there is a poly-silicon gate floating in a $SiO_2$ insulating layer with no direct electrical connection with surroundings. This circuit stores "1" or "0" according to whether the floating gate is charged. After the floating gate is charged (for example, negative charge), a positive conducting channel is induced right under the floating gate between the source and the drain such that the MOS is conductive, which means "0" is stored. If the floating gate is uncharged, no conductive channel will be formed such that the MOS is non-conductive, which means "1" is stored.

The basic memory cell circuit of EEPROM is similar to that of EPROM, in which over the floating gate of the basic cell circuit of the EPROM, a floating gate is additionally generated. The former is referred to as a primary floating gate, while the latter is referred to as a secondary floating gate. An electrode can be led from the secondary floating gate, such that the secondary floating gate is connected to a voltage VG. If the VG is a positive voltage, a tunnel effect may be formed between the primary floating gate and the drain, such that the electrons can be injected into the primary floating gate, i.e., write-in programming. If the VG is a negative voltage, the electrons of the primary floating gate will dissipate, i.e., erasing. It can be re-written after erasure.

The basic memory cell circuit of the flash memory is similar to that of EEPROM, which is formed by double-layer floating gate MOS. However, a first layer of gate dielectric is very thin and used as a tunnel oxide layer to lead an electrode for the secondary floating gate, such that the secondary floating gate is connected to a voltage VG. If the VG is a positive voltage, a tunnel effect may be formed between the primary floating gate and the drain, such that the electrons can be injected into the primary floating gate, i.e., write-in programming; in the erasure method, a positive voltage (VB) is applied to a substrate, and by utilizing the tunnel effect between the primary floating gate and the source, the negative charges injected into the floating gate are attracted to the source. With improvement in semiconductor technology, the flash memory has achieved a single transistor design, in which, basically, a floating gate and a select gate are added to the original transistor such the floating gate for maintaining electrons can be formed on the semiconductor with unidirectional conduction of current between the source and the drain. The floating gate wraps a layer of silicon oxide film insulator. A select/control gate is arranged on its top for controlling conduction current between the source and the drain. Whether data is "0" or "1" depends on the presence of electrons in the floating gate formed on the silicon substrate. The presence of electrons is indicated by "0", while the absence of electrons is indicated by "1".

Hereinafter, non-volatile memory erasure method and device of the present application will be described in detail by way of following embodiments, respectively. It should be noted that each of the following embodiments is described by an example of flash memory. However, the present application is not limited to the flash memory as a non-volatile flash memory.

First Embodiment

With reference to FIG. 1, it shows a flow chart of a non-volatile memory erasure method according to a first embodiment of the application. The method may particularly include steps of:

Step 101, after receiving an erasure instruction, performing pre-reading verification on a target erasure area corresponding to the erasure instruction.

If the pre-reading verification passes, then the process may execute Step 102; if the pre-reading verification fails, then the process may execute Step 103.

In the prior art, to avoid the problem that the convergence of the threshold voltages of the memory cells within the target erasure area after the erasure operation is inferior due to both Erase cell and Pgm cell within the target erasure area before the erasure operation, a pre-programming process is usually performed prior to the erasure operation so as to improve the convergence of the threshold voltage of the memory cells within the target erasure area. However, if the target erasure area is in a full-erasure state, aforesaid pre-programming process will result in unnecessary time expenditure.

For above problem, in the embodiment of the application, if the non-volatile memory receives the erasure instruction during normal operation, the pre-reading verification is first performed on the target erasure area corresponding to the erasure instruction, but not the pre-programming process is performed directly on the target erasure area.

Step 102, performing an erasure operation on the target erasure area.

If the pre-reading verification passes at Step 101, it could be proved that the inherent threshold voltages of the memory cells within the target erasure area have high convergence at the moment. Therefore, the pre-programming process can be skipped to perform the erasure operation directly on the target erasure area. After the erasure operation, it could be ensured that threshold voltages of the memory cells within the target erasure area have high convergence.

Step 103, performing pre-programming verification on the target erasure area, and after the pre-programming verification passes, performing the erasure operation on the target erasure area.

If the pre-reading verification fails at Step 101, it could be proved that the memory cells within the target erasure area include both Erase cell and Pgm cell at the moment and thus the pre-programming verification can be performed on the target erasure area. If the pre-programming verification fails, the pre-programming operation may be performed on the target erasure area to program the Erase cell into Pgm cell, thereby ensuring the convergence of the threshold voltages of the memory cells within the target erasure area before the erasure operation; if the pre-programming verification passes, it could be proved that the threshold voltages of the memory cells within the target erasure area have high convergence at the moment, such that the erasure operation can be performed on the target erasure area.

In the embodiment of the application, the pre-reading verification is first performed prior to the pre-programming verification. If the pre-reading verification passes, the pre-programming verification process could be skipped to directly perform the erasure operation. Therefore, it is possible to eliminate unnecessary pre-programming verification process while ensuring the target erasure area is in the full-erasure state before the erasure operation, thereby saving erasure time and simplifying the erasure process.

Second Embodiment

Figure 2:
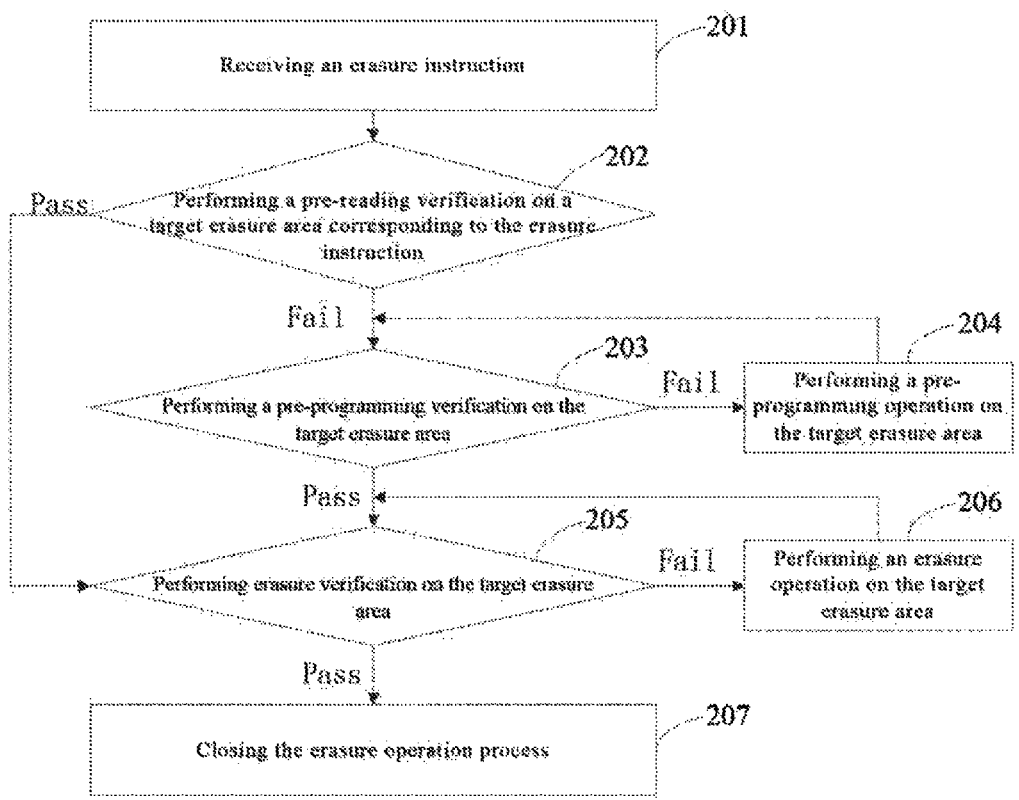
FIG. 2 is a flow chart showing a non-volatile memory erasure method according to a second embodiment of the application.

With reference to FIG. 2, it shows a flow chart of a non-volatile memory erasure method according to a second embodiment of the application. The method may particularly include steps of:

Step 201, receiving an erasure instruction.

Step 202, performing a pre-reading verification on a target erasure area corresponding to the erasure instruction.

If the pre-reading verification fails, then the process may execute Step 203; if the pre-reading verification passes, then the process may execute Step 205.

If there is a need to perform the erasure operation on the non-volatile memory during the normal operation, the erasure instruction will be received. The erasure instruction may contain information on target erasure area address. The target erasure area corresponding to the erasure instruction can be located according to the target erasure area address. In the embodiment of the application, the target erasure area could be chip, block or sector.

After the erasure instruction is received, the pre-reading verification (PRE_RD) may be first performed on the target erasure area corresponding to the erasure instruction. In a preferred embodiment of the application, Step 202 may particular include: performing the pre-reading verification on the target erasure area according to a predefined pre-reading verification reference voltage.

In a preferred embodiment of the application, the step of performing the pre-reading verification on the target erasure area according to the predefined pre-reading verification reference voltage may particularly include following sub-steps:

Sub-step a1, verifying whether the threshold voltage of each memory cell within the target erasure area is less than the pre-reading verification reference voltage, respectively; and Sub-step a2, if the threshold voltage of each memory cell is less than the pre-reading verification reference voltage, determining the pre-reading verification passes; otherwise determining the pre-reading verification fails.

If the threshold voltage of each memory cell is less than the pre-reading verification reference voltage, it could be proved that the inherent threshold voltages of the memory cells within the target erasure area have high convergence at the moment (for example, the target erasure area is in the full-erasure state at the moment), thereby determining the pre-reading verification passes. If there is a memory cell within the target erasure area having a threshold voltage greater than or equal to the pre-reading verification reference voltage, it could be proved that the threshold voltages of the memory cells within the target erasure area have inferior convergence, thereby determining the pre-reading verification fails.

Since current characteristics of the memory cells in the non-volatile memory are similar to MOS, when voltage difference between the gate and the source is less than the threshold voltage, the tube is non-conductive with no current at the moment. Therefore, when judging a threshold voltage of a memory cell, it is only required to apply a defined voltage to the gate and judge the amount of the current of the drain.

For example, Sub-step a1 may include following sub-steps:

Sub-step a11, for each memory cell within the target erasure area, applying a predefined pre-reading verification voltage to a gate of the memory cell and detecting a drain current of the memory cell; and Sub-step a12, if the drain current of the memory cell is greater than a predefined pre-reading verification reference current, determining the threshold voltage of the memory cell is less than the pre-reading verification reference voltage; if the drain current of the memory cell is less than or equal to the predefined pre-reading verification reference current, determining the threshold voltage of the memory cell is greater than or equal to the pre-reading verification reference voltage.

Figure 3:
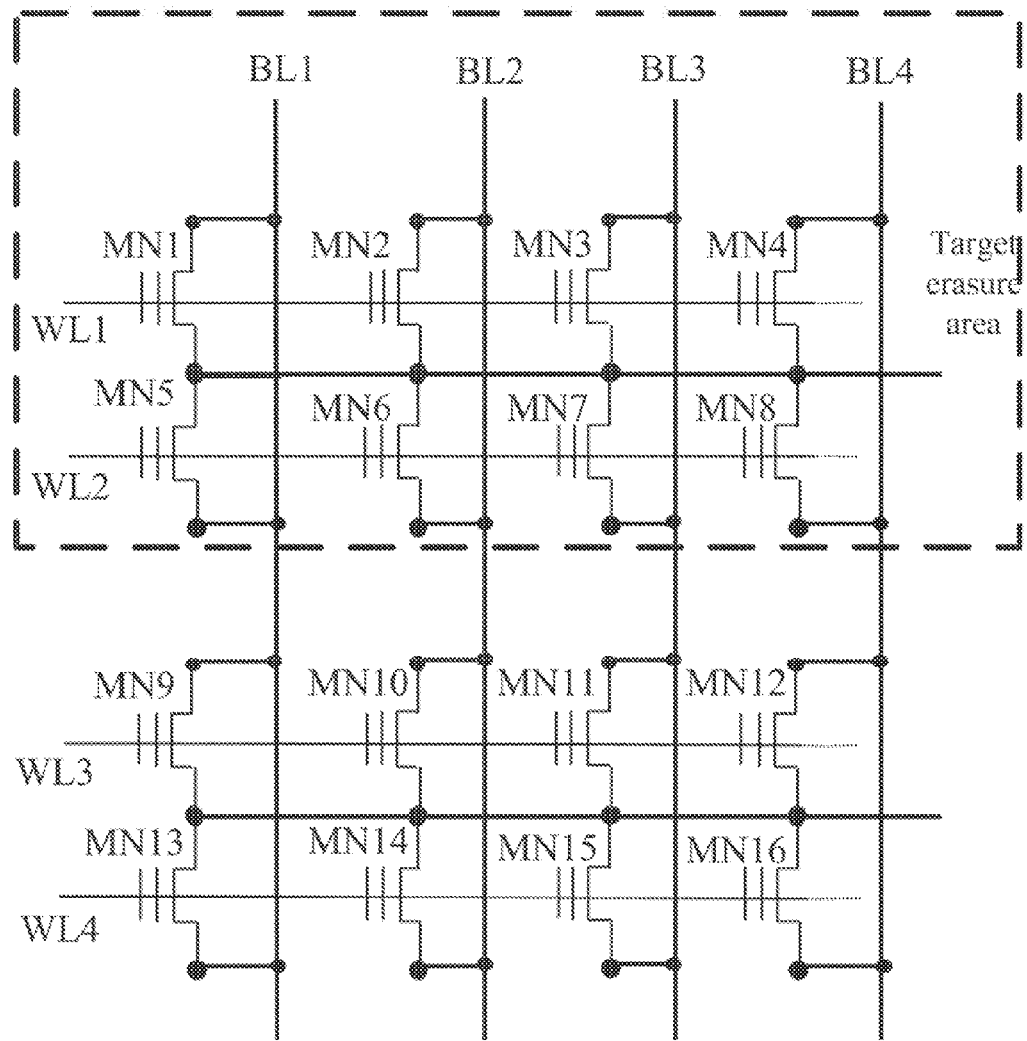
FIG. 3 is a schematic structural diagram of a non-volatile memory.

With reference to FIG. 3, it shows a schematic structural diagram of a non-volatile memory. The non-volatile memory may include 16 memory cells (MN1, MN2, MN3, MN4 . . . MN16), 4 bit lines (BL1, BL2, BL3 and BL4) and 4 word lines (WL1, WL2, WL3 and WL4). Herein, the memory cells form an array of memory cells, in which gates of the memory cells in one row of the array are connected to one word line, while drains of the memory cells in one column are connected to one bit line. The erasure operation of the non-volatile memory is performed by blocks. That is, the erasure operation is performed on the memory cells within one erasure area each time.

It should be explained, for the purpose of brief description, although the non-volatile memory as shown in FIG. 3 is illustrated simply as a structure including 16 memory cells (MN1, MN2, MN3, MN4 . . . MN16), 4 bit lines (BL1, BL2, BL3 and BL4) and 4 word lines (WL1, WL2, WL3 and WL4) for example, the non-volatile memory in the embodiment of the application is not limited to this structure and the numbers of memory cells, word lines and bit lines included therein may be possibly varied.

In the case of the structure as shown in FIG. 3, at Sub-step a11, it is possible to apply the predefined pre-reading verification voltage to the word lines within the target erasure area in sequence, and then to detect the current of each bit line. For example, the predefined pre-reading verification voltage is first applied to a word line WL1 within the target erasure area, which means the predefined pre-reading verification voltage is applied to the gate of each memory cell in the first row at the moment; currents of respective bit lines within the target erasure area are detected, wherein the current of bit line BL1 corresponds to the drain current of memory cell MN1, the current of bit line BL2 corresponds to the drain current of memory cell MN2, the current of bit line BL3 corresponds to the drain current of memory cell MN3, and the current of bit line BL4 corresponds to the drain current of memory cell MN4. The processing method for the remaining memory cells within the target erasure area is substantially the same as the processes as described above, detailed description of which will be omitted in the embodiments of the application. It should be explained, in above detection process, the source of each memory cell within the target erasure area is grounded, and while the predefined pre-reading verification voltage is applied to a word line, the voltage is not applied to the remaining word lines, which means it is desirable to ensure the drains of the memory cell not in connection with the word line to which the predefined pre-reading verification voltage is applied could not produce current.

For specific values of the pre-reading verification reference voltage, the pre-reading verification voltage and the pre-reading verification reference current involved at Step 202, they could be defined by those skilled in the art according to practical experience. The specific values may be varied dependently on non-volatile memories and should not be restricted by the embodiments of the application.

Step 203, performing a pre-programming verification on the target erasure area.

If the pre-programming verification fails, then the process may execute Step 204; if the pre-programming verification passes, then the process may execute Step 205.

If the pre-reading verification fails at Step 202, it could be proved that the threshold voltages of the memory cells within the target erasure area have inferior convergence. Therefore, it is possible to improve the convergence of the threshold voltages of the memory cells by performing a pre-programming verification (PRE_V) process on the target erasure area. In a preferred embodiment of the application, Step 203 may particularly include: performing the pre-programming verification on the target erasure area according to a predefined pre-programming verification reference voltage.

In a preferred embodiment of the application, the step of performing the pre-programming verification on the target erasure area according to the predefined pre-programming verification reference voltage may particularly include following sub-steps:

Sub-step b1, verifying whether the threshold voltage of each memory cell within the target erasure area is greater than the pre-programming verification reference voltage, respectively; and Sub-step b2, if the threshold voltage of each memory cell is greater than the pre-programming verification reference voltage, determining the pre-programming verification passes; otherwise determining the pre-programming verification fails.

The purpose of the pre-programming verification is for verifying success of the pre-programming operation. If the threshold voltage of each memory cell is greater than the pre-programming verification reference voltage, it could be determined that the pre-programming verification passes; if there is a memory cell within the target erasure area having a threshold voltage less than or equal to the pre-programming verification reference voltage, it could be determined that the pre-programming verification fails.

Above Sub-step b1 may include following sub-steps:

Sub-step b11, for each memory cell within the target erasure area, applying a predefined pre-programming verification voltage to a gate of the memory cell and detecting a drain current of the memory cell; and Sub-step b12, if the drain current of the memory cell is less than a predefined pre-programming verification reference current, determining the threshold voltage of the memory cell is greater than the pre-programming verification reference voltage; if the drain current of the memory cell is greater than or equal to the predefined pre-programming verification reference current, determining the threshold voltage of the memory cell is less than or equal to the pre-programming verification reference voltage.

For example, for the structure as shown in FIG. 3, at Sub-step b11, it is possible to apply the predefined pre-programming verification voltage to the word lines within the target erasure area in sequence, and then to detect the current of each bit line. Specific processes may refer to the related description at Step 202, detailed description of which will be omitted in the embodiments of the application.

For specific values of the pre-programming verification reference voltage, the pre-programming verification voltage and the pre-programming verification reference current involved at Step 203, they could be defined by those skilled in the art according to practical experience. The specific values may be varied dependently on non-volatile memories and should not be restricted by the embodiments of the application.

Step 204, performing a pre-programming operation on the target erasure area.

If the pre-programming verification fails at Step 203, it could be proved that the pre-programming operation fails. Therefore, at the moment, it is possible to perform the pre-programming operation on the target erasure area. The pre-programming operation means to write "0" into the memory cells within the target erasure area, the purpose of which is for programming the threshold voltage of each memory cell within the target erasure area to a level over the pre-programming verification reference voltage.

In the embodiment of the application, a specific process of the pre-programming operation may include: applying a gate pre-programming voltage to the gate of each memory cell within the target erasure area, and applying a drain pre-programming voltage to the drain of each memory cell within the target erasure area. For example, it is possible to apply a voltage of 9V to the gate and apply a voltage of 4V to the drain. The specific values may be varied dependently on the technologies.

After the pre-programming operation, the process may return to Step 203 to perform the pre-programming verification on the target erasure area again.

Step 205, performing erasure verification on the target erasure area.

If the erasure verification fails, then the process may execute Step 206; if the erasure verification passes, then the process may execute Step 207.

If the pre-reading verification passes at Step 202, it could be proved that the inherent threshold voltages of the memory cells within the target erasure area have high convergence at the moment at the moment (for example, at the moment, the target erasure area is in the full-erasure state). Therefore the pre-programming verification process can be skipped to perform the erasure verification (EV) directly on the target erasure area. If the pre-programming verification passes at Step 203, it could be proved that the pre-programming verification is successful at the moment, which means the threshold voltage of each memory cell within the target erasure area has been programmed to a level over the pre-programming verification reference voltage. At the moment, it is also possible to perform the erasure verification on the target erasure area. In the embodiment of the application, Step 205 may particularly include: performing the erasure verification on the target erasure area according to a predefined erasure verification reference voltage.

In a preferred embodiment of the application, the step of performing the erasure verification on the target erasure area according to the predefined erasure verification reference voltage may particularly include following sub-steps:

Sub-step c1, verifying whether the threshold voltage of each memory cell within the target erasure area is less than the erasure verification reference voltage, respectively; and Sub-step c2, if the threshold voltage of each memory cell is less than the erasure verification reference voltage, determining the erasure verification passes; otherwise determining the erasure verification fails.

The purpose of the erasure verification is for verifying success of the erasure operation. If the threshold voltage of each memory cell is less than the erasure verification reference voltage, it could be determined that the erasure verification passes; if there is a memory cell within the target erasure area having a threshold voltage greater than or equal to the erasure verification reference voltage, it could be determined that the erasure verification fails.

Above Sub-step c1 may include following sub-steps:

Sub-step c11, for each memory cell within the target erasure area, applying a predefined erasure verification voltage to a gate of the memory cell and detecting a drain current of the memory cell; and Sub-step c12, if the drain current of the memory cell is greater than the predefined erasure verification reference current, determining the threshold voltage of the memory cell is less than the erasure verification reference voltage; if the drain current of the memory cell is less than or equal to the predefined erasure verification reference current, determining the threshold voltage of the memory cell is greater than or equal to the erasure verification reference voltage.

For example, for the structure as shown in FIG. 3, at Sub-step c11, it is possible to apply the predefined erasure verification voltage to the word lines within the target erasure area in sequence, and then to detect the current of each bit line. Specific processes may refer to the related description at Step 202, detailed description of which will be omitted in the embodiments of the application.

For specific values of the erasure verification reference voltage, the erasure verification voltage and the erasure verification reference current involved at Step 205, they could be defined by those skilled in the art according to practical experience. The specific values may be varied dependently on non-volatile memories and should not be restricted by the embodiments of the application.

In a preferred embodiment of the application, the pre-reading verification reference voltage is greater than or equal to the erasure verification reference voltage but less than or equal to the pre-programming verification reference voltage.

Step 206, performing an erasure operation on the target erasure area.

If the erasure verification fails at Step 205, it could be proved that the erasure operation fails. At the moment, it is possible to perform the erasure operation on the target erasure area. The erasure operation means to write "1" into the memory cells within the target erasure area, the purpose of which is for erasing the threshold voltage of each memory cell within the target erasure area to a level below the erasure verification reference voltage.

In the embodiment of the application, a specific process of the erasure operation may include: applying a gate erasure voltage to the gate of each memory cell within the target erasure area, and applying a drain erasure voltage to the substrate of each memory cell within the target erasure area. For example, it is possible to apply a voltage of −9V to the gate and apply a voltage of 4V to the substrate. The specific values may be varied dependently on the technologies.

After the erasure operation, the process may return to Step 205 to perform the erasure verification on the target erasure area again.

Step 207, closing the erasure operation process.

If the erasure verification passes at Step 205, it could be proved that the erasure operation is successful and thus the erasure operation process is closed.

For above processes, it is possible to first execute Step 204 and then the process may execute Step 203. That is, if the pre-reading verification fails at Step 202, then the process may execute Step 204 and successively execute Step 203 following Step 204; if the pre-programming verification fails at Step 203, then the process may return to Step 204; if the pre-programming verification passes at Step 203, then the process may execute Step 205. For above processes, it is also possible to first execute Step 206 and successively execute Step 205. That is, if the pre-reading verification fails at Step 203, then the process may execute Step 206 and successively execute Step 205 following Step 206; if the erasure verification fails at Step 205, then the process may return to Step 206; if the erasure verification passes at Step 205, then the process may execute Step 207.

In addition, in a preferred embodiment of the application, after performing the erasure operation on the target erasure area at Step 206, it is also possible to perform over-erasure verification (OEV) on the target erasure area. The over-erasure verification means to adjust the threshold voltages of the memory cells within the target erasure area, the purpose of which is for weakly programming possible memory cells, which are over-erased and which have a threshold less than 0V, to increase their threshold to a level over 0V. The operating method may particularly include: applying an OEV programming voltage to the gate and the drain of the memory cell (for example, it is possible to apply 0V to the gate and apply around 4V to the drain, which could be varied dependently on the technologies). Detailed description on the specific process of the over-erasure verification will be omitted in the embodiment of the application.

The method according to the embodiment of the application can eliminate unnecessary pre-programming verification process while ensuring the target erasure area is in the full-erasure state before the erasure operation, thereby saving erasure time and simplifying the erasure process.

The method embodiments as described above, for the purpose of brief description, are described as a series of combined actions. However, it should be appreciated by those skilled in the art that the embodiments of the application should not be restricted by the sequence of the actions as set forth, since some of actions could be performed in different sequence or simultaneously according to the application. Moreover, it should also be appreciated by those skilled in the art that, the embodiments as described in the specification are preferred embodiments and actions and modules concerned are not necessarily required in the application.

Third Embodiment

Figure 4:
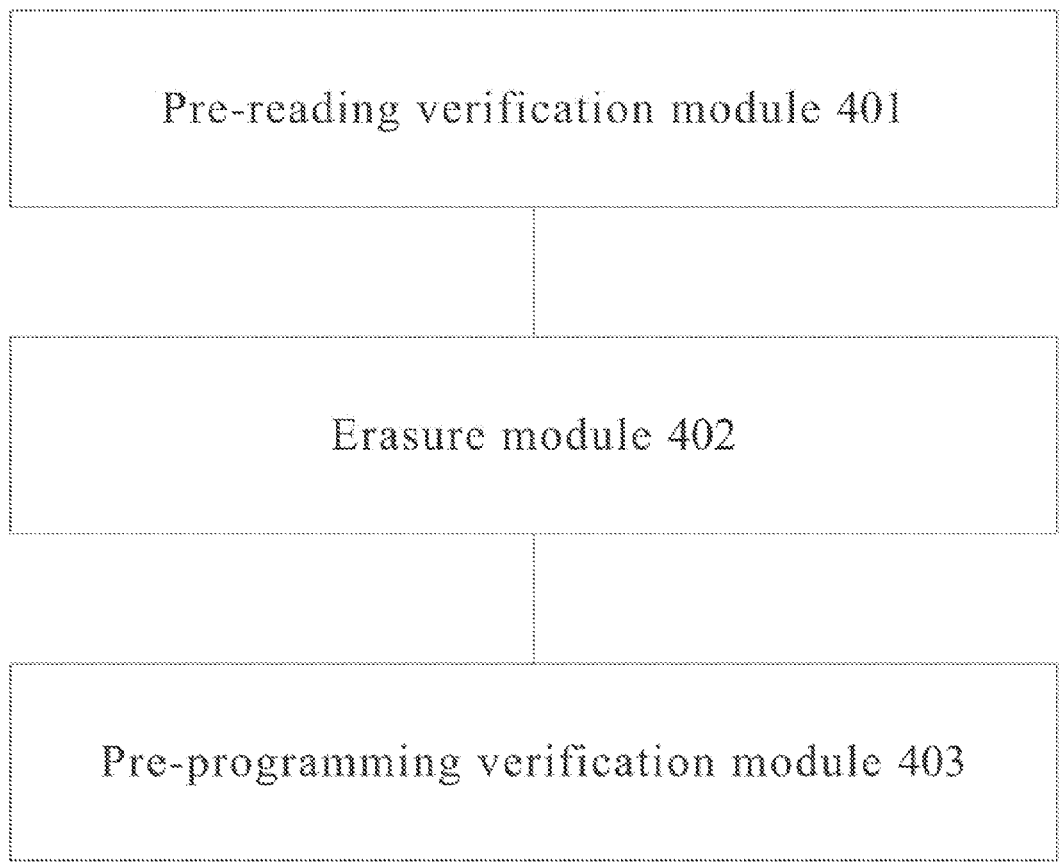
FIG. 4 is a diagram block showing a non-volatile memory erasure device according to a third embodiment of the application.

With reference to FIG. 4, it shows a diagram block of a non-volatile memory erasure device according to a third embodiment of the application.

The device may particularly include following modules:

a pre-reading verification module 401, configured to, after receiving an erasure instruction, perform pre-reading verification on a target erasure area corresponding to the erasure instruction;

an erasure module 402, configured to, when the pre-reading verification passes, perform an erasure operation on the target erasure area; and a pre-programming verification module 403, configured to, when the pre-reading verification fails, perform pre-programming verification on the target erasure area, the erasure module being further configured to, when the pre-programming verification passes, perform the erasure operation on the target erasure area.

In a preferred embodiment of the application, the device may further include following modules:

a pre-programming module, configured to, when the pre-programming verification fails, perform a pre-programming operation on the target erasure area, the pre-programming verification module being further configured to, after the pre-programming module performs the pre-programming operation on the target erasure area, perform the pre-programming verification on the target erasure area;

an erasure verification module, configured to, before the erasure module performs the erasure operation on the target erasure area, perform erasure verification on the target erasure area, the erasure module being further configured to, when the erasure verification fails, perform the erasure operation on the target erasure area, and the erasure verification module being further configured to, after the erasure module performs the erasure operation on the target erasure area, perform the erasure verification on the target erasure area.

Herein, the pre-reading verification module is particularly configured to perform the pre-reading verification on the target erasure area according to a predefined pre-reading verification reference voltage.

The pre-programming verification module is particularly configured to perform the pre-programming verification on the target erasure area, according to a predefined pre-programming verification reference voltage.

The erasure verification module is particularly configured to perform the erasure verification on the target erasure area, according to a predefined erasure verification reference voltage.

Herein, the erasure verification reference voltage is less than or equal to the pre-reading verification reference voltage but greater than or equal to the pre-reading verification reference voltage.

In a preferred embodiment of the application, the pre-reading verification module may include following modules:

a voltage verification module, configured to verify whether the threshold voltage of each memory cell within the target erasure area is less than the pre-reading verification reference voltage, respectively; and a determination module, configured to determine the pre-reading verification passes if the threshold voltage of each memory cell is less than the pre-reading verification reference voltage; otherwise, determine the pre-reading verification fails.

The voltage verification module may include following modules:

a detection module, configured to, for each memory cell within the target erasure area, apply a predefined pre-reading verification voltage to a gate of the memory cell and detect a drain current of the memory cell; and a determination module, configured to determine the threshold voltage of the memory cell is less than the pre-reading verification reference voltage, if the drain current of the memory cell is greater than the predefined pre-reading verification reference current.

In the embodiment of the application, after the erasure instruction is received, the pre-reading verification is first performed on the target erasure area corresponding to the erasure instruction; if the pre-reading verification passes, then the erasure operation may be performed on the target erasure area; if the pre-reading verification fails, then the pre-programming verification may be performed on the target erasure area, and after the pre-programming verification passes, the erasure operation may be performed on the target erasure area. In the embodiment of the application, the pre-reading verification is first performed prior to the pre-programming verification. If the pre-reading verification passes, the pre-programming verification process could be skipped to directly perform the erasure operation. Therefore, it is possible to eliminate unnecessary pre-programming verification process while ensuring the target erasure area is in the full-erasure state before the erasure operation, thereby saving erasure time and simplifying the erasure process.

Since the device embodiments are substantially similar to the method embodiments, the description thereof is relatively simple. For the device embodiments, reference can be made to related parts of the method embodiments.

In an embodiment of the application, there is also provided a computer readable recording medium in which a program for executing the embodiments as described above is recorded.

The computer readable recording medium may comprise any mechanism for storing or transmitting information in a computing device (e.g., a computer) readable form. For example, the machine readable medium includes Read Only Memory (ROM), Random Access Memory (RAM), magnetic disk storage medium, optical storage medium, flash memory medium, and propagation signals (e.g., carrier wave, infrared signals, digital signals, etc.) in the forms of electrics, optics, acoustics or any other forms.

The various embodiments in the specification have been explained step by step. Each of the embodiments has only emphasized the differences from others, and for the same or similar parts between embodiments, reference could be made to each other.

The present application can be described in general context of a computer executable instruction which is executed by the computer, such as a program module. Generally, the program modules may include routine, program, object, component, data structure and the like which can perform particular tasks or implement particular abstract data types. The present application can also be practiced in distributed computing environments. In such a distributed computing environment, the program modules can be connected to a remote processing device through a communication network to perform the task. In the distributed computing environment, the program modules may be located in local and remote computer storage medium including a memory device.

In the end, it will be explained that, the relative terms "first", "second", etc. are only used herein to distinguish one element or operation from one another, and does not necessarily require or suggest that there are any actual relationship or sequence between these elements or operations. Further, the terms "comprise", "include" and any other variants thereof are intended to cover a non-exclusive "comprise", so that process, method, product or equipment which includes a series of elements may include not only those elements, but also other elements that do not be definitely listed, or also may include the inherent elements of the process, method, product or equipment. In the absence of more restrictions, an element defined by the statement "includes a . . . " does not mean to exclude other same elements in the process, method, product or equipment including this element.

The non-volatile memory erasure method and device according to the application have been described in detail. Herein the principles and embodiments of the present application are illustrated by way of specific examples. The embodiments described above are only intended to help understand the method and one of main concepts of the application. Meanwhile, for an ordinary skilled person in the art, variations could be made to the specific embodiments and their application scope in accordance with one of concepts of the application. In summary, the disclosure of the specification should not be construed as limiting of the present application.

What is claimed is:

1. A non-volatile memory erasure method, wherein, the method comprises:

after receiving an erasure instruction, performing pre-reading verification on a target erasure area corresponding to the erasure instruction, if the pre-reading verification passes, then performing an erasure operation on the target erasure area; and if the pre-reading verification fails, then performing pre-programming verification on the target erasure area, and after the pre-programming verification passes, performing the erasure operation on the target erasure area;

wherein, the step of performing pre-reading verification on the target erasure area corresponding to the erasure instruction comprises: performing the pre-reading verification on the target erasure area according to a predefined pre-reading verification reference voltage;

the step of performing pre-programming verification on the target erasure area comprises: performing the pre-programming verification on the target erasure area according to a predefined pre-programming verification reference voltage, wherein, the predefined pre-reading verification reference voltage is less than or equal to the predefined pre-programming verification reference voltage.

2. The method according to claim 1, wherein, the target erasure area comprises a plurality of memory cells, the step of performing the pre-reading verification on the target erasure area according to the predefined pre-reading verification reference voltage comprises:

verifying whether a threshold voltage of each memory cell within the target erasure area is less than the pre-reading verification reference voltage, respectively;

if the threshold voltage of each memory cell is less than the pre-reading verification reference voltage, then determining the pre-reading verification passes; otherwise determining the pre-reading verification fails.

3. The method according to claim 2, wherein, the step of verifying whether the threshold voltage of each memory cell within the target erasure area is less than the pre-reading verification reference voltage respectively comprises:

for each memory cell within the target erasure area, applying a predefined pre-reading verification voltage to a gate of the memory cell and detecting a drain current of the memory cell; and if the drain current of the memory cell is greater than a predefined pre-reading verification reference current, then determining the threshold voltage of the memory cell is less than the pre-reading verification reference voltage.

4. The method according to claim 1, wherein, before performing the erasure operation on the target erasure area, the method further comprises:

performing erasure verification on the target erasure area;

if the erasure verification fails, then executing the step of performing the erasure operation on the target erasure area; and after the erasure operation, returning to the step of performing the erasure verification on the target erasure area.

5. The method according to claim 4, wherein, the step of performing the erasure verification on the target erasure area comprises:

performing the erasure verification on the target erasure area according to a predefined erasure verification reference voltage, wherein, the erasure verification reference voltage is less than on equal to the pre-reading verification reference voltage.

6. The method according to claim 1, wherein, after performing the pre-programming verification on the target erasure area, the method further comprises:

if the pre-programming verification fails, then performing a pre-programming operation on the target erasure area, and after the pre-programming operation, returning to the step of performing the pre-programming verification on the target erasure area.

7. A non-volatile memory erasure device, wherein, the device comprises:

a processor; and a memory for storing instructions executable by the processor, wherein the processor is configured to:

after receiving an erasure instruction, perform pre-reading verification on a target erasure area corresponding to the erasure instruction;

when the pre-reading verification passes, perform an erasure operation on the target erasure area; and when the pre-reading verification fails, perform pre-programming verification on the target erasure area, when the pre-programming verification passes, perform the erasure operation on the target erasure area;

wherein perform the pre-reading verification on the target erasure area according to a predefined pre-reading verification reference voltage;

perform the pre-programming verification on the target erasure area according to a predefined pre-programming verification reference voltage, wherein, the predefined pre-reading verification reference voltage is less than or equal to the predefined pre-programming verification reference voltage.

8. The device according to claim 7, wherein, the target erasure area comprises a plurality of memory cells,
the processor is further configured to:
verify whether a threshold voltage of each memory cell within the target erasure area is less than the pre-reading verification reference voltage, respectively; and
determine the pre-reading verification passes if the threshold voltage of each memory cell is less than the pre-reading verification reference voltage; otherwise, determine the pre-reading verification fails.

9. The device according to claim 8, wherein, the processor is further configured to:
for each memory cell within the target erasure area, apply a predefined pre-reading verification voltage to a gate of the memory cell and detect a drain current of the memory cell; and
determine the threshold voltage of the memory cell is less than the pre-reading verification reference voltage, if the drain current of the memory cell is greater than the predefined pre-reading verification reference current.

10. The device according to claim 7, wherein, the processor is further configured to:
before the erasure operation on the target erasure area, perform erasure verification on the target erasure area;
when the erasure verification fails, perform the erasure operation on the target erasure area, and
after the erasure operation on the target erasure area, perform the erasure verification on the target erasure area.

11. The device according to claim 10, wherein, the processor is further configured to: perform the erasure verification on the target erasure area according to a predefined erasure verification reference voltage, the erasure verification reference voltage is less than or equal to the pre-reading verification reference voltage.

12. The device according to claim 7, wherein, wherein the processor is further configured to:
when the pre-programming verification fails, perform a pre-programming operation on the target erasure area,
after the pre-programming operation on the target erasure area, perform the pre-programming verification on the target erasure area.

13. A computer readable medium, which stores thereon computer program that, when executed by one or more processors of a non-volatile memory erasure device, causes the device to perform:
after receiving an erasure instruction, performing pre-reading verification on a target erasure area corresponding to the erasure instruction;
if the pre-reading verification passes, then performing an erasure operation on the target erasure area; and
if the pre-reading verification fails, then performing pre-programming verification on the target erasure area, and after the pre-programming verification passes, performing the erasure operation on the target erasure area;
wherein, the performing pre-reading verification on the target erasure area corresponding to the erasure instruction comprises: performing the pre-reading verification on the target erasure area according to a predefined pre-reading verification reference voltage;
the performing pre-programming verification on the target erasure area comprises: performing the pre-programming verification on the target erasure area according to a predefined pre-programming verification reference voltage,
wherein the predefined rereading verification reference voltage is less than or equal to the predefined pre-programming verification reference voltage.

* * * * *